(12) United States Patent
Chen et al.

(10) Patent No.: US 8,541,779 B1
(45) Date of Patent: Sep. 24, 2013

(54) PIXEL STRUCTURE OF ORGANIC ELECTROLUMINESCENCE APPARATUS

(75) Inventors: Hong-Syu Chen, Taipei (TW); Shou-Wei Fang, Taipei (TW); Jen-Yu Lee, Taoyuan County (TW); Tsung-Hsiang Shih, New Taipei (TW); Hsueh-Hsing Lu, Hsinchu County (TW); Chia-Yu Chen, Hsinchu County (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 13/606,027

(22) Filed: Sep. 7, 2012

(30) Foreign Application Priority Data

May 16, 2012 (TW) ............................. 101117445 A

(51) Int. Cl.
*H01L 29/08* (2006.01)
(52) U.S. Cl.
USPC .............................................. 257/40; 438/99
(58) Field of Classification Search
USPC .................................. 257/40, 43; 438/85, 99
See application file for complete search history.

(56) References Cited

U.S. PATENT DOCUMENTS

| | | | |
|---|---|---|---|
| 7,345,304 B2 * | 3/2008 | Sakai | 257/40 |
| 7,935,969 B2 | 5/2011 | Yamashita et al. | |
| 2006/0043886 A1 * | 3/2006 | Lee et al. | 313/506 |
| 2011/0193121 A1 | 8/2011 | Jeong | |
| 2011/0198653 A1 | 8/2011 | Cho | |
| 2011/0291128 A1 * | 12/2011 | Harada et al. | 257/88 |

* cited by examiner

*Primary Examiner* — Ha Tran T Nguyen
*Assistant Examiner* — Paul Noel
(74) *Attorney, Agent, or Firm* — Jianq Chyun IP Office

(57) ABSTRACT

A pixel structure of an organic electroluminescence apparatus includes at least an active device connected to a scan line and a data line, a first electrode, a dielectric material layer, a first isolating layer, a second isolating layer, an organic light-emitting material layer and a second electrode. The dielectric material layer is disposed on the first electrode and has a first opening to expose the first electrode. The first isolating layer disposed on the dielectric material layer includes an oxide semiconductor material and has a second opening to expose the first electrode. The second isolating layer is disposed on the first isolating layer and has a third opening to expose the first electrode in the first opening and the first isolating layer in a sidewall of the second opening. The organic light-emitting material layer is in the third opening. The second electrode is on the organic light-emitting layer.

14 Claims, 3 Drawing Sheets

PIXEL STRUCTURE OF ORGANIC ELECTROLUMINESCENCE APPARATUS

CROSS-REFERENCE TO RELATED APPLICATION

This application claims the priority benefit of Taiwan application serial no. 101117445, filed on May 16, 2012. The entirety of the above-mentioned patent application is hereby incorporated by reference herein and made a part of this specification.

BACKGROUND

This document relates to a pixel structure, and particularly, relates to a pixel structure of an organic electroluminescence apparatus.

DESCRIPTION OF RELATED ART

The organic electroluminescence apparatus is a self-illumination display apparatus, which is expected to become the mainstream of the next-generation flat-panel display due to its advantages of having wide viewing angles, low power consumption, simple manufacturing process, low costs and having a wide range of operating temperatures, high response speed and full-color display. Generally, the organic electroluminescence apparatus includes a plurality of pixel structures and each pixel structure includes a plurality of active devices (e.g. thin film transistors) or passive devices (e.g. resistance, capacitance or inductance) and cathodes or anodes electrically connected to the active devices and an organic light-emitting layer disposed between the cathodes and anodes.

The current method of manufacturing an organic light-emitting layer is mainly an inkjet printing method. Organic light-emitting materials are first dissolved in a solution to make the ink used in the inkjet printing method, and then the inkjet printing is performed. The advantage of using this inkjet printing technique is that a desired pattern can be printed from organic light-emitting materials through a single step without having to use a mask or a screen. In addition, this technique only requires steps such as alignment, inkjet printing and so on, but without steps such as exposure, development and so on. Furthermore, manufacturing costs may be further reduced since less equipment is used and the utilization rate of materials is high in the inkjet printing.

Organic materials suitable for inkjet printing are flowable liquids, therefore, liquid organic light-emitting materials are placed in an opening formed in an isolating layer, and the opening of which is formed before the inkjet printing. Nevertheless, the problem of choosing a suitable material for an isolating layer arises in view of the adhesion of organic light-emitting materials, and that whether the material used is hydrophobic or hydrophilic should also be taken into account at the same time. Also, when an opening is formed, the material of the isolating layer and the surfaces of the anodes are prone to the damages of dry etching agents, which leads to low reliability of the pixel structure of the organic electroluminescence apparatus.

SUMMARY OF THE DISCLOSURE

The disclosure provides a pixel structure of an organic electroluminescence apparatus, which may reduce the damages to the materials of the isolating layers caused by etching agents.

In one aspect, a pixel structure of an organic electroluminescence apparatus includes a scan line, a data line, at least an active device, a first electrode, a dielectric material layer, a first isolating layer, a second isolating layer, an organic light-emitting material layer and a second electrode. The at least one active device is electrically connected with the scan line and the data line. The dielectric material layer is disposed on the first electrode and the dielectric material layer has a first opening to expose the first electrode. The first isolating layer is disposed on the dielectric material layer, wherein the first isolating layer includes an oxide semiconductor material and the first isolating layer has a second opening to expose the first electrode. The second isolating layer is disposed on the first isolating layer, wherein the second isolating layer has a third opening to expose the first electrode in the first opening and the first isolating layer in a sidewall of the second opening. The organic light-emitting material layer is in the third opening. The second electrode is disposed on the organic light-emitting material layer and either one of the first electrode or second electrode is electrically connected to at least one active device.

Based on the above, the first isolating layer including the oxide semiconductor material is patterned with a wet etch method, so that damages caused by etching agents to the surface of the first electrode may be reduced. Thus, the reliability of the pixel structure of the organic electroluminescence apparatus may be further improved.

In order to make the aforementioned features and advantages of the invention more comprehensible, embodiments accompanying figures are described in detail below.

BRIEF DESCRIPTION OF THE DRAWINGS

The accompanying drawings, which are included to provide a further understanding of the invention and are incorporated on and constitute a part of this specification, illustrate embodiments of the invention and together with the description serve to explain the principles of the invention. In the drawings.

DESCRIPTION OF EMBODIMENTS

Reference will now be made in detail embodiments of the invention examples of which are illustrated in the accompanying drawings.

Figure 1:
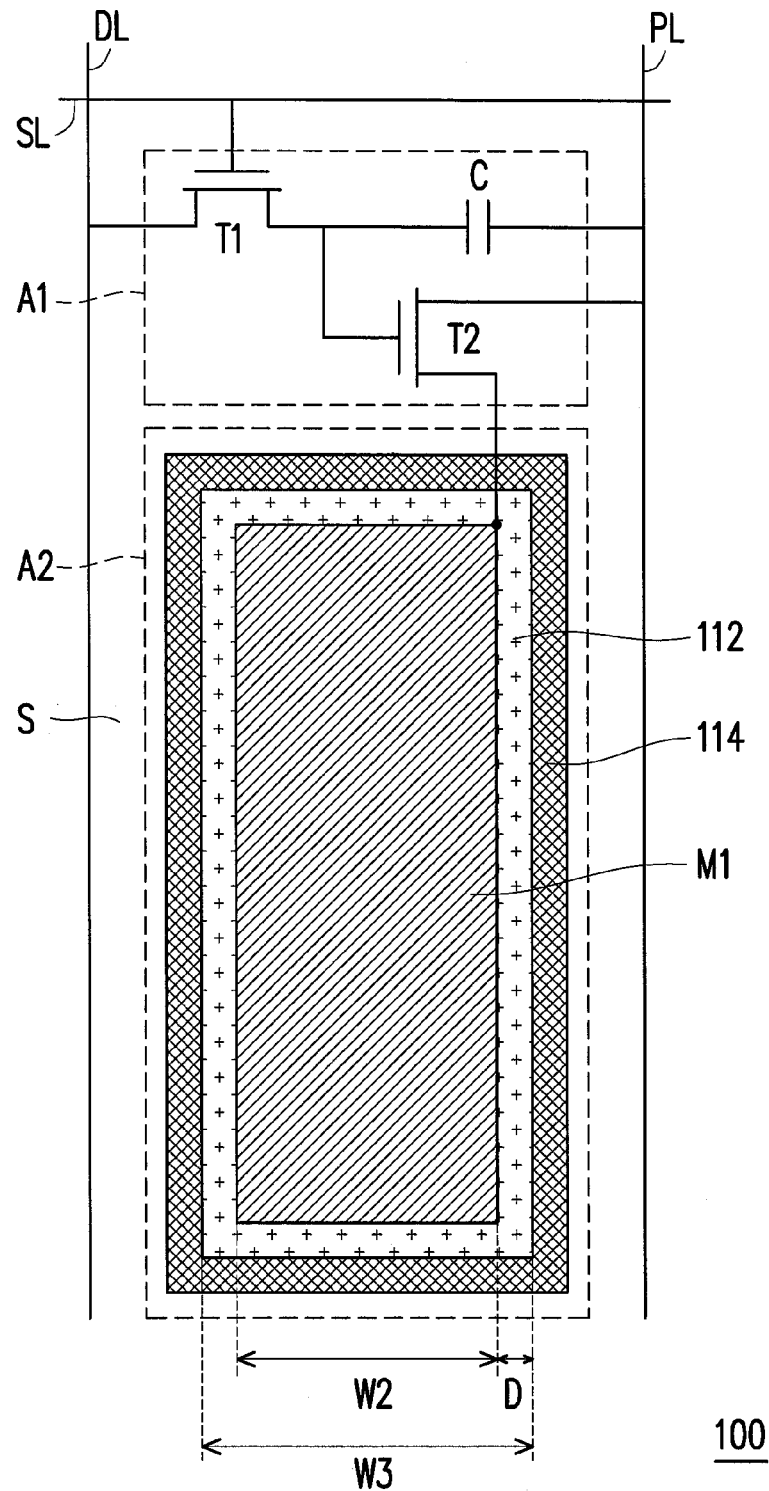
FIG. 1 is a top schematic view of the partial pixel structure of the organic electroluminescence apparatus according to an exemplary embodiment.
Figure 2A:
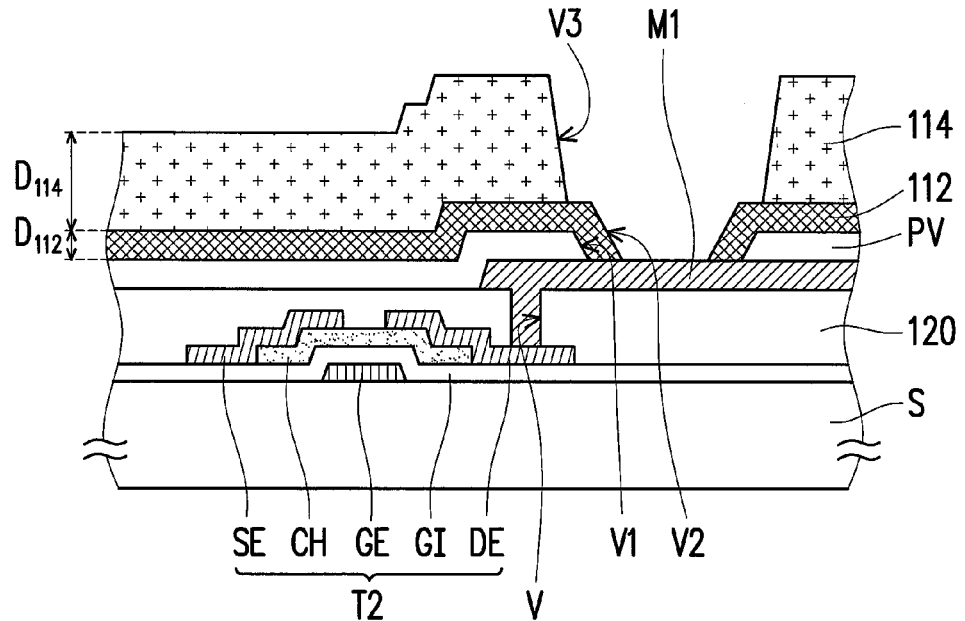
FIG. 2A is a partial cross-sectional schematic view corresponding to the active device of FIG. 1.
Figure 2B:
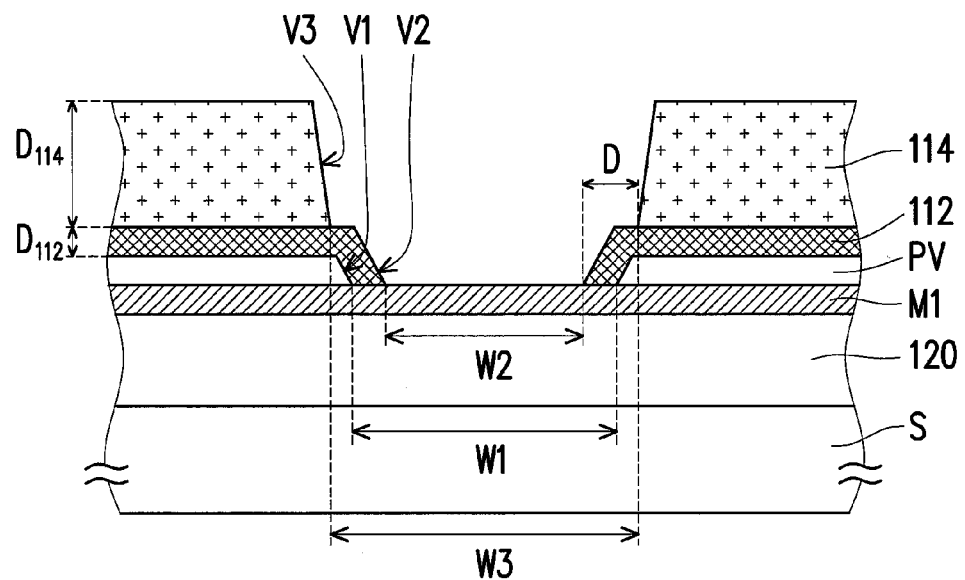
FIG. 2B is a cross-sectional schematic view corresponding to FIG. 1 along the line I-I'.

FIG. 1 is a top schematic view of the partial pixel structure of the organic electroluminescence apparatus according to an exemplary embodiment. Part of the film layers are omitted in FIG. 1 for the sake of easy illustration. FIG. 2A is a partial cross-sectional schematic view corresponding to the active device of FIG. 1, while FIG. 2B is a cross-sectional schematic view corresponding to the line I-I' of FIG. 1.

Referring to FIG. 1, the pixel structure 100 of the organic electroluminescence apparatus in this embodiment is disposed on a substrate S. In this embodiment, the substrate S may be a transparent substrate, which includes glass, quartz, organic polymers, or other suitable materials, but it is not limited herein. In other embodiments, if the organic electroluminescence apparatus is a top emission light-emitting apparatus, the substrate S may be made of opaque or reflective materials (e.g. conductive materials, metals, wafers, ceramics or other suitable materials) or other suitable materials.

The pixel structure 100 of the organic electroluminescence apparatus includes a scan line SL, a data line DL and at least an active device T1, T2. In this embodiment, the pixel structure 100 of the organic electroluminescence apparatus may further include a power line PL, and the data line DL and the power line PL may be selectively substantial disposed in parallel, while the data line DL and the power line PL may be disposed crossing over the scan line SL.

Furthermore, the pixel structure 100 of the organic electroluminescence apparatus may be divided into an active device region A1 and an emissive region A2. In the active device region A1, the active device T1 is electrically connected to the scan line SL and the data line DL; the active device T2 is electrically connected to the active device T1 and the power line PL, and a capacitor C is electrically connected to the active devices T1 and T2. The active devices T1 and T2 may be, for example, thin film transistors, wherein the active device T1 in this embodiment may serve as a switch device, while the active device T2 may serve as a driving device for driving the devices in the emissive region A2. In this embodiment, the active device region A1 is illustrated with two active devices T1 and T2 accompanied by a capacitor C structure (2T1C), however, such an illustration is not meant to limit it's. In other words, neither the number of active devices and capacitors, nor their relative locations in the active device region A1 are limited herein.

Please refer to FIG. 1 and FIG. 2A. The active device T2 includes a gate GE, a source SE, a drain DE and a channel layer CH. The gate GE, source SE and drain DE may be made of metals or metal-stacked layers with good conductivity, while the channel layer CH may be made of semiconductor materials such as silicon, amorphous silicon, polysilicon, an organic semiconductor material, an oxide semiconductor materials, or a metal oxide semiconductor material. The metal oxide semiconductor material include indium-gallium-zinc oxide (IGZO), zinc oxide (ZnO), tin oxide (SnO), indium-zinc oxide (IZO), gallium-zinc oxide (GZO), indium-gallium oxide (IGO), aluminum-zinc oxide (AlZnO), zinc-tin oxide (ZTO), gallium-tin oxide (GTO), antimony-tin oxide (ATO) or indium-tin oxide (ITO), or a stack layers of at least two of the above.

To be specific, the gate GE is disposed on the substrate S and the channel layer CH covers the gate GE, and the orthographic projection of the channel layer CH on the substrate S overlaps with the orthographic projection of the gate GE on the substrate S. The source SE and the drain DE are insulated from each other, and the two are disposed on the opposite two sides of the channel layer CH. In this embodiment, the active device T2 may further include a gate insulating layer GI disposed between the gate GE and the channel layer CH, and the gate insulating layer GI covers the gate GE. In this embodiment, the active device T2 is, for example, a bottom gate, however, it is not limited herein. In other words, in other embodiments, the active device T2 may also be a top gate thin film transistor. On the other hand, the structure of the active device T1 may be selectively the same or different from that of the active device T2 and the structure of the active device T2 may be a bottom gate or top gate transistor, however, it is not limited herein.

Also, the pixel structure 100 of the organic electroluminescence apparatus includes a first electrode M1, a dielectric material layer PV, a first isolating layer 112 and a second isolating layer 114. In this embodiment, the pixel structure 100 of the organic electroluminescence apparatus may selectively include a passivation layer 120 covering the active device T1, so that the first electrode M1, which is desired to be formed, may be formed on a flat surface subsequently. In addition, the passivation layer 120 also covers the active device T2 and that it has an opening V to expose the drain DE in the active device T2. In this embodiment, the first electrode M1 is electrically connected to the drain DE in the active device T2 through the opening V. However, it is not limited herein.

Please refer to FIG. 2B. The first electrode M1 is on the passivation layer 120 and the first electrode M1 may also be named as pixel electrode. The first electrode M1 may be transparent conductive materials or opaque conductive materials. In other embodiments, a pixel electrode may be first formed below the first electrode M1 when the first electrode M1 is not served as a pixel electrode, and the first electrode M1 contacts the pixel electrode. The materials of the first electrode M1 may be selectively the same of different from those of the pixel electrode. The transparent conductive material include a metal oxide material, such as ITO, IZO, ATO, AZO, IGZO, other suitable metal oxides, or a stack layer of at least two of the above. The opaque conductive material may include a metal, an alloy, a metal-stacked layer, an alloy-stacked layer or other suitable light-shielding materials, or a stack layer of at least two of the above. The organic electroluminescence apparatus may be a top emission and bottom emission apparatus when the first electrode M1 is made of transparent conductive materials. The organic electroluminescence apparatus may be a top emission apparatus when the first electrode M1 is made of opaque conductive materials.

The dielectric material layer PV is on the first electrode M1 and the dielectric material layer PV has a first opening V1 to expose part of the first electrode M1. In addition, the materials of the dielectric material layer PV may include silicon oxide, silicon nitride, silicon oxynitride, aluminum oxide, aluminum nitride, aluminum oxynitride, or a stack layer of at least two of the above. Preferably, the material of the dielectric material layer PV is, for example, aluminum oxide. However, it is not limited herein.

The first isolating layer 112 is on the dielectric material layer PV and has a second opening V2 to expose the first electrode M1 in the first opening V1. Specifically, the first isolating layer 112 further covers the dielectric material layer PV in a sidewall of the first opening V1, so that the width W2 of the second opening V2 is substantially less than the width W1 of the first opening V1. In addition, the thickness $D_{112}$ of the first isolating layer 112 is, for example, between about 500 Å to about 2000 Å. Furthermore, the first isolating layer 112 includes an oxide semiconductor material. The oxide semiconductor material includes IGZO, ZnO, SnO, IZO, GZO, IGO, AlZnO, ZTO, GTO, ATO or ITO, or a stack layer of at least two of the above.

In one embodiment, when the first isolating layer 112 is made of materials similar to the materials of the channel layer CH of the active device T2, preferably, an oxide semiconductor material is used as an example, the sheet resistance of the oxide semiconductor material of the first isolating layer 112 may be substantially greater than or equal to the sheet resistance of the channel layer CH of the active device T2. Specifically, the sheet resistance of the oxide semiconductor material of the first isolating layer 112 is, for example, substantially greater than 1.1E9 Ω/sq, while the sheet resistance of the channel layer CH of the active device T2 is, for example, substantially greater than 1E9 Ω/sq. Therefore, the oxide semiconductor material of the first isolating layer 112 will not be conducted when a voltage is applied and the problem of a leakage current can be prevented.

In addition, the way the oxide semiconductor material is formed may be achieved through an inkjet printing method. Therefore, the inkjet printing method does not require steps such as exposure, development and so on, but only requires steps such as alignment, inkjet printing and so on, and that manufacturing costs may be reduced due to less equipment used and high utilization rate of materials in the inkjet printing method. Or else, the oxide semiconductor material can be formed in other ways, such as screen printing, lift-off, laser ablation, photo-etching and so on.

In addition, as compared with conventional art, in which an opening is formed through patterning an isolating layer by dry etching, and as a result, the surface of the first electrode will be damaged; while in this embodiment, a second opening V2 of the first isolating layer 112 is formed by patterning the oxide semiconductor layer with oxalic acid or orthoaluminic acid. Thereby, the damages to the surface of the first electrode by etching agents may be reduced, and the reliability of the pixel structure of the organic electroluminescence apparatus may be further improved.

The second isolating layer 114 is disposed on the first isolating layer 112, wherein the second isolating layer 114 has a third opening V3 to expose the first electrode M1 in the first opening V1 and the first isolating layer 112 in the sidewall of the second opening V2. Specifically, the width W3 of the third opening V3 is substantially greater than the width W2 of the second opening V2, so that there is a distance D between the sidewall of the third opening V3 and that of the second opening V2. That is to say, the width W3 of the third opening V3 is, preferably, substantially greater than the width W1 of the first opening V1. In this embodiment, the distance D is approximately 2 micrometers. In other embodiments, the width W3 of the third opening V3 may be substantially equal to the width W1 of the first opening V1. In addition, the thickness $D_{114}$ of the second isolating layer 114 is, for example, between about 3 micrometers to about 5 micrometers. Furthermore, the second isolating layer 114 includes an organic insulating material. The insulating material includes polyimide, acrylic, polyamide, polyimide amide, resist, benzocyclobutene, siloxane polymer, other suitable materials, stack layers of at least the two of the above, or the combination layer of at least the two of the above.

The method of forming the third opening V3 may be through methods of photolithography process, laser ablation process, or dry etch to pattern the organic insulating material. What is worth noting is that the first isolating layer 112 may serve as a hard mask while the second isolating layer 114 is being dry-etched in this embodiment. In other words, the oxide semiconductor material of first isolating layer 112 may be free from the damages of the dry etching agents, and the reliability of the pixel structure of the organic electroluminescence apparatus could be ensured.

In this embodiment, the first electrode M1 and the first isolating layer 112 are, for example, hydrophilic or lipophobic, while the second isolating layer 114 is, for example, hydrophobic or oleophilic. Therefore, the material of the organic light-emitting material layer may be successfully disposed on the first electrode M1 and between the sidewalls of the first isolating layer 112 of the second opening V2, when the organic light-emitting material layer (not shown) is formed by inkjet printing method subsequently.

It is worth noting that the first isolating layer 112 and the second isolating layer 114 can not only bear the organic light-emitting material layer 116 but also shield the light leakage emitted from the sides. Specifically, the light emitted from the organic light-emitting material layer 116 will be partly absorbed after passing through the first isolating layer 112 and the second isolating 114, so that the light leakage from the sides may be reduced.

Figure 3A:
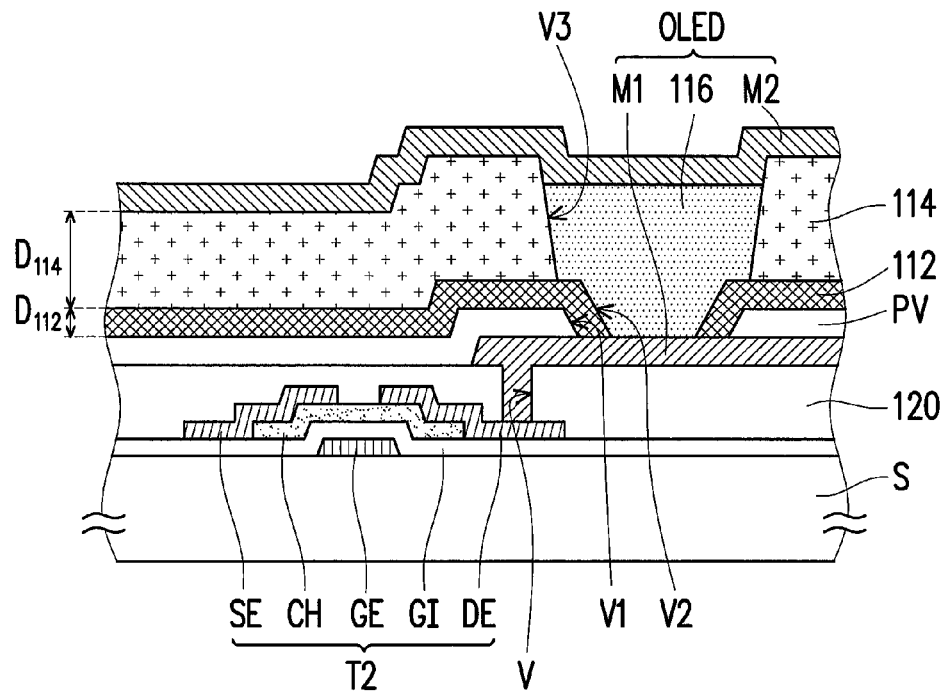
FIG. 3A is a partial cross-sectional schematic view illustrating an active device of the pixel structure according to the exemplary embodiment.

It is to be explained here that the film layer disposed on the second isolating layer 114 is not illustrated in FIG. 1, FIG. 2A and FIG. 2B for the sake of easy illustration. Therefore, please refer to FIG. 3A and FIG. 3B for detailed descriptions. FIG. 3A is a cross-sectional schematic view of the pixel structure of the active device in the exemplary embodiment, while FIG. 3B is a cross-sectional schematic view of the pixel structure of the organic electroluminescence apparatus in the embodiment.

Figure 3B:
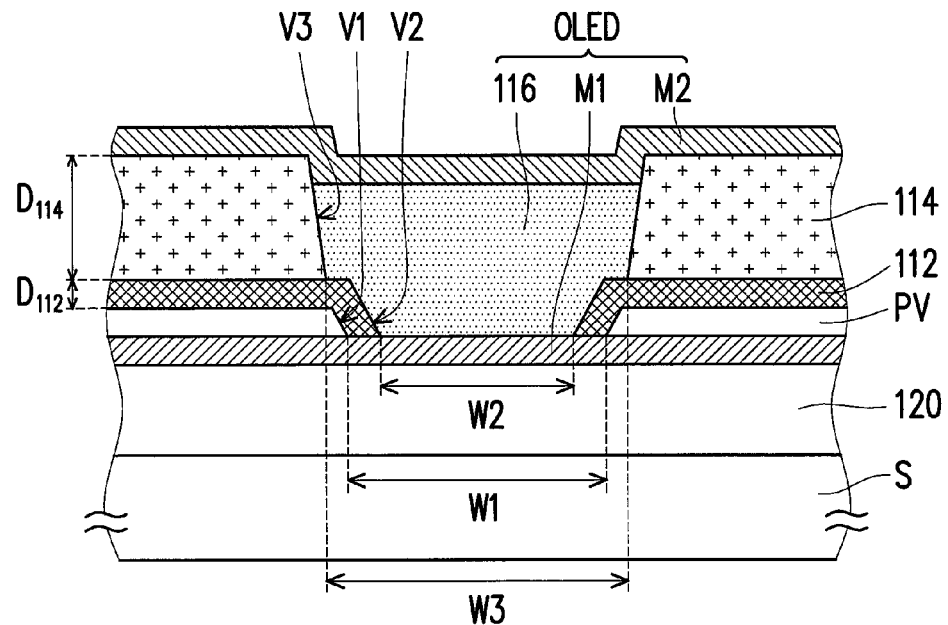
FIG. 3B is a cross-sectional schematic view of the emissive region of the pixel structure of the organic electroluminescence apparatus according to the exemplary embodiment.

Please refer to FIG. 3A and FIG. 3B. The pixel structure of the organic electroluminescence apparatus 100 further includes an organic light-emitting material layer 116 and a second electrode M2 to become a complete pixel structure. The organic light-emitting material layer 116 is in the third opening V3. In this embodiment, the organic light-emitting material layer 116 is on the first electrode M1 exposed in the second opening V2 and is contacted with the sidewall of the first isolating layer 112 and part of the sidewall of the second isolating layer 114, and the rest of the sidewall of the second isolating layer 114 is exposed. In addition, the organic light-emitting material layer 116 may include red organic light-emitting patterns, green organic light-emitting patterns, blue organic light-emitting patterns, and organic light-emitting patterns of other colors or the combination of at least two of the above organic light-emitting patterns. Furthermore, the organic light-emitting material layer 116 may further include at least one of an electron transfer layer and a hole transfer layer. The electron transfer layer may include at least one of an electron transport layer and an electron injection layer, while the hole transfer layer may include at least one of a hole transport layer and a hole injection layer (not shown). Preferably, the organic light-emitting material layer includes the films layers of the electron transfer layer and the hole transfer layer. Also, other film layers may be selected to be used in the organic electroluminescence apparatus to improve efficiency as the design may require. The other film layers may include an electron blocking layer, a hole blocking layer, a gain layer, a microcavity layer or other suitable film layers, or the combination of at least two of the above (e.g. mixing, stacking, etc.). The detailed structure of the organic electroluminescence apparatus is well-known to persons of ordinary skill in the art, and thus is not reiterated herein.

The second electrode M2 is disposed above the first electrode M1, and covers the organic light-emitting material layer 116 and the second isolating layer 114. It is to be explained that either one of the first electrode M1 or the second electrode M2 may be electrically connected to at least one active device T2 through the opening V. The example of the first electrode M1 connected to the active device T2 through the opening V is explained in this embodiment, however, it is not limited herein.

In addition, the second electrode M2 may be a patterned electrode layer or unpatterned electrode layer and can be made of a transparent conductive material or an opaque conductive material. The transparent conductive material includes a metal oxide, such as ITO, IZO, ATO, AZO, IGZO, other suitable metal oxides, or a stack layer of at least two of the above. The opaque conductive material may include a metal, an alloy, a metal-stacked layer, an alloy-stacked layer or other suitable light-shielding materials, or a stack layer of at least two of the above.

The first electrode M1, the second electrode M2 and the organic light-emitting material layer 116 constitute an organic light-emitting device (OLED). Generally, one of the first electrode M1 and the second electrode M2 is served as an anode of organic light-emitting device (OLED) while the other is as the cathode of the OLED. It is worth noting that the organic electroluminescence apparatus formed will be a double-sided lighting apparatus if the first electrode M1 and the second electrode M2 are both made of transparent conductive materials. If only one of the first electrode M1 and the second electrode M2 is made of transparent materials, then, the organic electroluminescence apparatus formed may be a single-sided lighting apparatus (including a top emission or a bottom emission).

Based on the above, the first isolating layer including the oxide semiconductor material is patterned with a wet etching process, damages caused by etching agents to the surface of the first electrode may be reduced. Thus, the reliability of the pixel structure of the organic electroluminescence apparatus may be further improved. Moreover, when the inkjet printing method is used to form the first isolating layer, it does not require steps such as exposure, development and so on, but only requires steps such as alignment, inkjet printing and so on, and that manufacturing costs may be reduced due to less equipment used and high utilization rate of materials in the inkjet printing method.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A pixel structure of an organic electroluminescence apparatus, including:
   a scan line and a data line;
   at least an active device electrically connected to the scan line and the data line;
   a first electrode;
   a dielectric material layer disposed on the first electrode, the dielectric material layer having a first opening to expose the first electrode;
   a first isolating layer disposed on the dielectric material layer, wherein the first isolating layer includes an oxide semiconductor material and the first isolating layer has a second opening to expose the first electrode;
   a second isolating layer disposed on the first isolating layer, wherein the second isolating layer has a third opening to expose the first electrode in the first opening and the first isolating layer in a sidewall of the second opening;
   an organic light-emitting material layer in the third opening; and
   a second electrode disposed on the organic light-emitting material layer, wherein either one of the first electrode or the second electrode is electrically connected to the at least one active device.

2. The pixel structure of claim 1, wherein a width of the third opening is substantially greater than a width of the second opening, so that there is a distance between a sidewall of the third opening and the sidewall of the second opening.

3. The pixel structure of claim 2, wherein the distance is approximately 2 micrometers.

4. The pixel structure of claim 1, wherein the first isolating layer covers the dielectric material layer in a sidewall of the first opening.

5. The pixel structure of claim 1, wherein a material of the dielectric material layer includes silicon oxide, silicon nitride, silicon oxynitride, aluminum oxide, aluminum nitride, aluminum oxynitride, or a stack layer of at least two of the above.

6. The pixel structure of claim 1, wherein the oxide semiconductor material includes indium-gallium-zinc oxide (IGZO), zinc oxide (ZnO), tin oxide (SnO), indium-zinc oxide (IZO), gallium-zinc oxide (GZO), indium-gallium oxide (IGO), aluminum-zinc oxide (AlZnO), zinc-tin oxide (ZTO), gallium-tin oxide (GTO), antimony-tin oxide (ATO) or indium-tin oxide (ITO), or a stack layers of at least two of the above.

7. The pixel structure of claim 1, wherein the active device includes a gate, a source, a drain and a channel layer, and the channel layer includes a metal oxide semiconductor material.

8. The pixel structure of claim 7, wherein a sheet resistance of the oxide semiconductor material of the first isolating layer is substantially greater than or equal to a sheet resistance of the channel layer of the active device.

9. The pixel structure of claim 8, wherein the sheet resistance of the oxide semiconductor material layer of the first isolating layer is substantially greater than $1.1E9\ \Omega/sq$ and the sheet resistance of the channel layer of the active device is substantially greater than $1E9\ \Omega/sq$.

10. The pixel structure of claim 1, further including a passivation layer covering the active device and the passivation layer having an opening, wherein either one of the first electrode or the second electrode electrically connected to the at lease one active device through the opening.

11. The pixel structure of claim 1, wherein a thickness of the first isolating layer ranges from about 500 Å to about 2000 Å.

12. The pixel structure of claim 1, wherein a thickness of the second isolating layer ranges from about 3 micrometers to about 5 micrometers.

13. The pixel structure of claim 1, wherein the second isolating layer includes an organic insulating material.

14. The pixel structure claim 1, wherein the first electrode and the first isolating layer are hydrophilic and the second isolating layer is hydrophobic.

* * * * *